US012715615B2

(12) United States Patent
Arcouët et al.

(10) Patent No.: US 12,715,615 B2
(45) Date of Patent: Aug. 25, 2026

(54) PROCESS FOR DIGITAL DIAGNOSIS OF A SYSTEM OF ACTUATORS IN AN AIRCRAFT UNDERGOING MAINTENANCE

(71) Applicant: SAFRAN NACELLES, Gonfreville-l'Orcher (FR)

(72) Inventors: Patrick Arcouët, Moissy-Cramayel (FR); David Pereira, Moissy-Cramayel (FR); Hakim Maalioune, Moissy-Cramayel (FR)

(73) Assignee: SAFRAN NACELLES, Gonfreville-l'Orcher (FR)

( * ) Notice: Subject to any disclaimer, the term of this patent is extended or adjusted under 35 U.S.C. 154(b) by 161 days.

(21) Appl. No.: 18/717,834

(22) PCT Filed: Dec. 9, 2022

(86) PCT No.: PCT/FR2022/052290
§ 371 (c)(1),
(2) Date: Jun. 7, 2024

(87) PCT Pub. No.: WO2023/105173
PCT Pub. Date: Jun. 15, 2023

(65) Prior Publication Data

US 2025/0058898 A1 Feb. 20, 2025

(30) Foreign Application Priority Data

Dec. 10, 2021 (FR) ...................................... 2113275

(51) Int. Cl.
*G01R 31/00* (2006.01)
*B64F 5/60* (2017.01)
*G01R 31/28* (2006.01)

(52) U.S. Cl.
CPC ............. *B64F 5/60* (2017.01); *G01R 31/008* (2013.01); *G01R 31/2829* (2013.01)

(58) Field of Classification Search
None
See application file for complete search history.

(56) References Cited

U.S. PATENT DOCUMENTS 12,306,239 B2 * 5/2025 Battut .................. G01R 31/008
2010/0242434 A1 9/2010 Bader et al.
(Continued)

FOREIGN PATENT DOCUMENTS

EP 2241948 A2 10/2010
FR 2920201 A1 2/2009

OTHER PUBLICATIONS

Search Report and Written Opinion issued in International Application No. PCT/FR2022/052290, mailed Apr. 25, 2023.
(Continued)

*Primary Examiner* — Jermele M Hollington
(74) *Attorney, Agent, or Firm* — Bookoff McAndrews, PLLC

(57) ABSTRACT

An electronic device for diagnosing the condition of a system of actuators of an aircraft turbine engine, the device being configured to be coupled to an electrical wiring harness of a turbine engine connecting a computer of a turbine engine to a system of actuators of the turbine engine, the device including a power supply block to power the device, a connection block configured to enable the connection of the device to the electrical wiring harness of the turbine engine to be diagnosed, a communication block configured to send information to a user and to receive instructions from the user, and a control block including a test signal transmission module and modules for measuring the signals received by the device in response to the test signals over a work cycle of the system of actuators of the turbine engine.

5 Claims, 1 Drawing Sheet

(56) References Cited

U.S. PATENT DOCUMENTS

2019/0186416 A1 6/2019 Seka et al.
2024/0011869 A1* 1/2024 Wasselin .............. F01D 21/003

OTHER PUBLICATIONS

Search Report issued in French Application No. 2113275, mailed Jul. 22, 2022.

* cited by examiner

[Fig.1]
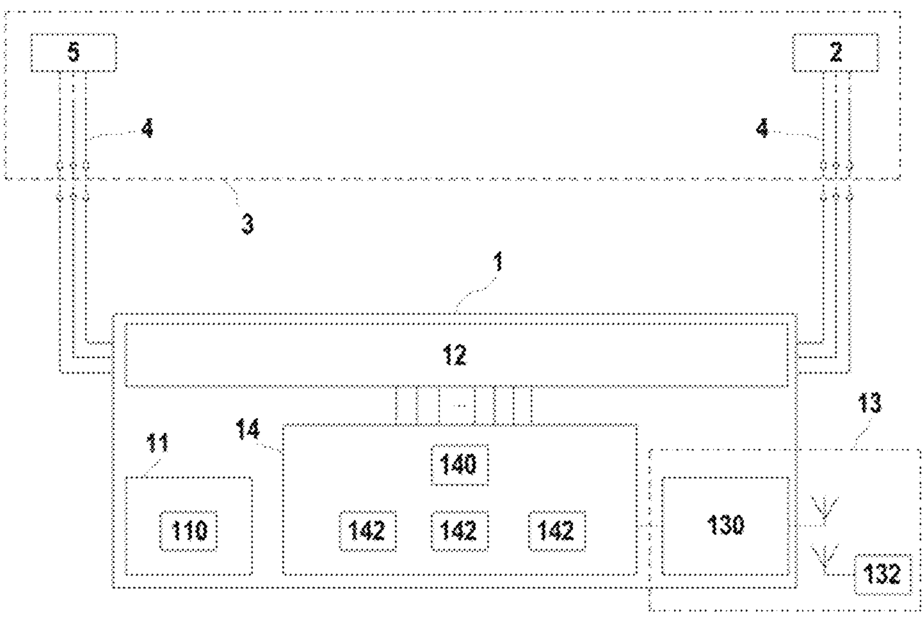
[Fig.2]
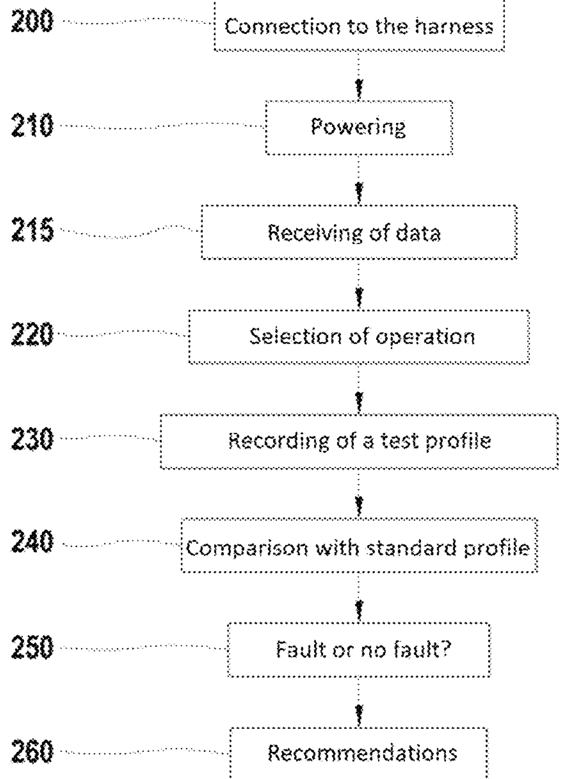

PROCESS FOR DIGITAL DIAGNOSIS OF A SYSTEM OF ACTUATORS IN AN AIRCRAFT UNDERGOING MAINTENANCE

CROSS-RERERENCE TO RELATED APPLICATIONS

This is a National Stage Application under 35 U.S.C. § 371 of International Application No. PCT/FR2022/052290, filed Dec. 9, 2022, now published as WO 2023/105173 A1, which claims priority to French Patent Application No. 2113275, filed on Dec. 10, 2021.

DESCRIPTION

Technical Field

The invention relates to the field of maintenance of an actuator system of an aircraft turbine engine, and more particularly to a system and process for the diagnosis of faults in said system, in particular a reverse thrust system.

The actuator system can also be an actuator system for landing gear, cargo door actuator system, flap, or rudder actuator system, etc.

Prior Art

Electrical continuity and insulation testing of a thrust reverse system on an aircraft turbine engine is time-consuming. To carry out these tests, all the connectors of the electrical wiring harness must be disconnected and measurements carried out wire by wire. All these tests are designated as anomaly diagnosis found in the Trouble Shooting Manual-TSM. One disadvantage of the TSM, in addition to being time-consuming, is that it does not point directly toward the possible cause. This implies lengthy and tedious set-up to identify any fault.

The TSM is therefore too complex and requires the removal of components to gain access for fault finding, this leading to many unjustified dismantling operations for possible detection, confirmation, or disproval of a fault.

In addition, automatic tests of BITE type (Buit-in Test Equipment) only give results at system level, and therefore do not allow the direct identification of a faulty component in the system. To do so, a fault search manual must be consulted for the indicated system failure. Also, the fault searching flowcharts in this manual are determined as a function of the known reliability of the components at a certain date and the maintainability thereof (ease of task and access) and are therefore of limited reliability.

Current methods for diagnosing faults of thrust reverse systems (TRAS—Thrust Reverser Actuation System), similar to those for other aircraft systems, do not take advantage of the development possibilities currently afforded by digital technology.

When scrolling through operating instructions such as given in particular in the anomaly diagnosis manual, the task of implementing the test means under a wing or in a workshop proves to be cumbersome from many viewpoints. In the process of finding faults via electrical continuity, the logic of the pathway is not always obvious for lack of a flow diagram clearly indicating the process and end purpose. The process lists possible causes one by one without giving consideration to other factors possibly confining the search for the most probable causes.

The bulk of a volume of paper comprising more instructions than are needed is not the most practical or economical or even ecofriendly. Electrical measuring apparatus does not integrate decision processing as a function of the work profile recorded over a cycle.

Finally, the disconnecting and connecting of equipment to be tested is not necessarily of easy access.

DESCRIPTION OF THE INVENTION

The invention sets out to provide a solution for diagnosing faults in an electromechanical or hydromechanical system of actuators in an aircraft turbine engine, that is less time consuming than the TSM and more end specific.

It is one object of the invention to propose an electronic device for diagnosing the condition of a system of actuators of an aircraft turbine engine, the device being configured to be coupled to an electrical wiring harness of a turbine engine connecting a computer of a turbine engine to a system of actuators of said turbine engine, the device comprising a power supply block for powering said device, a connection block configured to enable the connection of said device to the electrical wiring harness of the turbine engine to be diagnosed, a communication block configured to send information to a user and to receive instructions from the user, a control block comprising a module for transmitting test signals, and modules for measuring the signals received by the device in response to the test signals over a work cycle of the system of actuators of the turbine engine.

In a first embodiment of the device, the device may also comprise a casing inside which there are housed the power supply block and the control block, and at least partly the connection block.

In a second embodiment of the device, the power supply block may comprise a battery configured for self-powering of the electronic device.

In a third embodiment of the device, the communication block may comprise a wireless transmitting/receiving module allowing the sending and receiving of information on and from a remote apparatus e.g. a Wi-Fi or Bluetooth® communication device.

A further object of the invention is to propose a method of diagnosing the condition of a system of actuators of an aircraft turbine engine, the method comprising the coupling of an electronic diagnosis device such as defined above to the electrical harness of a turbine engine of an aircraft on the ground, the electrical harness connecting a computer of the turbine engine to a system of actuators, and the method further comprising powering the device.

According to a general characteristic of the invention, the method comprises the following steps:

- a step to receive the data sent by the actuator system subjected to a work cycle;
- selecting a test operation as a function of the received data;
- recording a test profile relating to the test operation over a work cycle of the system of actuators, the test profile being determined from measurements recorded on different components of said system of actuators;
- comparing the test profile with a standard profile,
- detecting the non-presence of a fault or presence of at least one fault from the result of comparison;
- transmitting recommendations relating to said at least one detected fault.

In a first embodiment of the process, the process may further comprise the performing of at least one additional test operation following after detection of a fault, to determine a secondary test profile and fine-tune recommendations.

In a second embodiment of the process of the invention, the process may further comprise transmission of the test profile to an analysis module before comparison is carried out, the detection and transmission of recommendations being performed by the analysis module, the analysis module being offset from the other elements of the electronic diagnosis device.

BRIEF DESCRIPTION OF THE DRAWINGS

FIG. 1 schematically illustrates an electronic device for diagnosing the condition of a system of electromechanical actuators of a turbine engine according to one embodiment of the invention.

FIG. 2 schematically illustrates a flowchart of a process for diagnosing the condition of a system of electromechanical actuators of an aircraft turbine engine.

DESCRIPTION OF EMBODIMENTS

FIG. 1 schematically illustrates an electronic device for diagnosing the condition of a system of electromechanical actuators of a turbine engine according to one embodiment of the invention. The invention applies both to an electromechanical actuator system and to a hydromechanical actuator system.

The electronic device 1 is configured to diagnose the condition of a system of electromechanical actuators 2 of an aircraft turbine engine 3. The system of electromechanical actuators 2 in FIG. 1 is a thrust reverse system of an aircraft turbine engine 3. The device 1 is configured to be coupled to an electrical wiring harness 4 of a turbine engine connecting a computer 5 of the turbine engine 3 to the system of electromechanical actuators 2 of the turbine engine 3.

The electronic device 1 is a diagnostic electronic device to carry out detection of any fault when the aircraft is on the ground. The device 1 comprises a power supply block 11 (Error in the Figure: «1» boxed instead of «11») to power the device 1, a connection block 12 configured to enable the connection of the device to the electrical wiring harness 4 of the turbine engine 3 to be diagnosed, a communication block 13 configured to send information to a user and to receive instructions from the user, and a control block 14 coupled to the power supply block 11, to the electrical connection block 12 and to the communication block 13. The device 1 comprises a casing inside which there are housed the power supply block 11, the control block 14, the connection block 12 and at least part of the communication block 13.

In the illustrated embodiment, the power supply block 11 comprises a battery 110 configured to power the electronic device independently of any other system and in particular independently of the turbine engine 3. In one variant, a power generator can be used to power the device 1.

The control block 14 also comprises a module 140 to transmit test signals, and modules 142 measuring the signals received by the device in response to the test signals over a work cycle of the system of electromechanical actuators of the turbine engine.

In the embodiment, the communication block may comprise a display screen with a panel enabling a user to send instructions or else, as illustrated in FIG. 1, a wireless transmitting/receiving module 130 allowing information to be sent and received on and from a remote apparatus 132.

In FIG. 2 a flowchart schematically illustrates a process for diagnosing the condition of a system of electromechanical actuators of an aircraft turbine engine, implemented by the electronic device in FIG. 1.

The process for diagnosing the condition of a system of electromechanical actuators first comprises a step 200 of electrically coupling the diagnosis device 1 to the electrical wiring harness 4 of a turbine engine 3 of an aircraft on the ground, the electrical harness 4 connecting a computer 5 of the turbine engine 3 to a system of electromechanical actuators 2 of the turbine engine.

The process next comprises a step 210 to power the device, and a step 215 to receive data from the system of electromechanical actuators subjected to a work cycle, for example deployment and retraction of a thrust reverser. This receiving step first allows the receiving of fault messages recorded by the aircraft computer during the flight.

The next step of the process is a step 220 by the user to select a test operation via the remote apparatus 132.

The selection 220 of the test operation is dependent upon the fault messages previously recorded by the aircraft computer during the flight, and received at the preceding step, upon messages sent by the maintenance center and collected by the operator, and also upon criteria not able to be electrically recorded by the system of electromechanical actuators but which can be measured manually by the operator when the aircraft is on the ground, for example mismatch between two cowls for a thrust reverser.

At a following step 230, the process comprises a step to record a test profile relating to the test operation over a work cycle of the system of electromechanical actuators. For this purpose, a maintenance operator initiates a recording cycle from a tablet, and another operator initiates a cycle of electromechanical actuators from the aircraft cockpit. Recording of the test profile comprises the recording of a plurality of measurements taken on different components of the system of electromechanical actuators 2. The measurements are chiefly current and voltage measurements.

At a following step 240, the process comprises a comparison of the recorded test profile with a standard profile stored in a memory of the control device. In one variant, prior to the comparison, the process may comprise transmission of the test profile to a remote apparatus 132 via the transmitting/receiving module 130, the comparison 240 being performed on the remote apparatus 132 using a standard profile recorded on the remote apparatus 132.

At a following step 250, the process comprises the detecting of the non-presence of a fault or the presence of at least one fault from the result of the comparison.

At a following step 260, the process may comprise the display of recommendations on a screen, in other words transmission of recommendations to the user, the recommendations relating to said at least one detected fault.

The invention therefore allows a solution to be provided for the diagnosis of faults on a system of electromechanical actuators of an aircraft turbine engine, that is less time-consuming than the TSM and more end specific.

The invention claimed is:

1. An electronic device for diagnosing a condition of a system of actuators of an aircraft turbine engine when the aircraft is on a ground, the device being configured to be coupled, during a diagnosis, to an electrical wiring harness of said turbine engine connecting a computer of said turbine engine to the system of actuators of said turbine engine, the device comprising a power supply block to power said device, a connection block configured to enable the connection of said device to the electrical wiring harness of the turbine engine to be diagnosed, a communication block configured to send information to a user and to receive instructions from the user, and a control block comprising a test signal transmission module and modules for measuring the signals received by the device in response to the test signals over a work cycle of the system of actuators of the turbine engine, the power supply block being configured for self-powering the electronic device by a battery or a power generator, independently of any other system and independently of the turbine engine to diagnose.

2. The device according to claim 1, wherein the communication block comprises a wireless transmitting/receiving module allowing the sending and receiving of information on and from a remote apparatus.

3. A process of diagnosing the condition of said system of actuators of an aircraft turbine engine, the process comprising the coupling of said electronic diagnosis device according to claim 1, to the electrical wiring harness of said turbine engine of said aircraft on the ground, the electrical harness connecting said computer of the turbine engine to said actuator system, and the process further comprising powering of the device, wherein the process comprises:

receiving data from the actuator system subjected to said work cycle, selecting a test operation as a function of the received data, recording a test profile related to the test operation over a work cycle of the actuator system, the test profile being determined from measurements taken on different components of said actuator system, comparing the test profile with a standard profile, detecting a non-presence of a fault or a presence of at least one fault from a result of the comparison, transmitting recommendations relating to said at least one detected fault.

4. The process according to claim 3, further comprising a performing of at least one additional test following after the detection of the presence of said at least one fault, to determine a secondary test profile for fine-tuning of the recommendations.

5. The process according to claim 3, further comprising the transmission of said test profile to an analysis module before comparison, the comparison, detection, and transmission of recommendations being performed by the analysis module, the analysis module being offset from other elements of the electronic diagnosis device.

* * * * *